US008415243B1

United States Patent
Kuo et al.

(10) Patent No.: US 8,415,243 B1
(45) Date of Patent: Apr. 9, 2013

(54) BUMPING PROCESS AND STRUCTURE THEREOF

(75) Inventors: Chih-Ming Kuo, Hsinchu County (TW); Yie-Chuan Chiu, Hsinchu (TW); Lung-Hua Ho, Hsinchu (TW)

(73) Assignee: Chipbond Technology Corporation, Hsinchu (TW)

( * ) Notice: Subject to any disclaimer, the term of this patent is extended or adjusted under 35 U.S.C. 154(b) by 0 days.

(21) Appl. No.: 13/352,530

(22) Filed: Jan. 18, 2012

(51) Int. Cl.
*H01L 21/44* (2006.01)

(52) U.S. Cl. ........ 438/612; 438/613; 438/614; 257/737; 257/738

(58) Field of Classification Search .......... 438/612–614; 257/737–738, 770, E23.021
See application file for complete search history.

(56) References Cited

U.S. PATENT DOCUMENTS 6,015,505 A * 1/2000 David et al. ................ 252/79.2
8,334,594 B2 * 12/2012 Lo et al. ....................... 257/737

* cited by examiner

*Primary Examiner* — Theresa T Doan
(74) *Attorney, Agent, or Firm* — Jackson IPG PLLC

(57) ABSTRACT

A bumping process includes providing a silicon substrate, forming a titanium-containing metal layer on the silicon substrate, wherein the titanium-containing metal layer comprises a plurality of first areas and a plurality of second areas, forming a photoresist layer on the titanium-containing metal layer, patterning the photoresist layer to form a plurality of opening slots, forming a plurality of bottom coverage layers at the opening slots, proceeding a heat procedure, forming a plurality of external coverage layers to make each of the external coverage layers connect with each of the bottom coverage layers, wherein said external coverage layer and said bottom coverage layer form a wrap layer and completely surround the copper bump, forming a plurality of connective layers on the external coverage layers, removing the photoresist layer, removing the second areas and enabling each of the first areas to form an under bump metallurgy layer.

7 Claims, 5 Drawing Sheets

BUMPING PROCESS AND STRUCTURE THEREOF

FIELD OF THE INVENTION

The present invention is generally related to a bumping process and structure thereof, which particularly relates to the bumping process which prevents the copper ions from dissociation.

BACKGROUND OF THE INVENTION

Modern electronic products gradually lead a direction of light, thin, short, and small. Accordingly, layout density of interior circuit for electronic product becomes more concentrated consequentially. However, a short phenomenon is easily occurred for mentioned circuit layout via a tiny gap between two adjacent electronic connection devices.

SUMMARY

The primary object of the present invention is to provide a bumping process comprising the steps of providing a silicon substrate having a surface, a plurality of bond pads disposed on said surface, and a protective layer disposed on said surface, wherein the protective layer comprises a plurality of openings, and the bond pads are revealed by the openings; forming a titanium-containing metal layer on the silicon substrate, said titanium-containing metal layer covers the bond pads and comprises a plurality of first areas and a plurality of second areas located outside the first areas; forming a photoresist layer on the titanium-containing metal layer; patterning the photoresist layer to form a plurality of opening slots, wherein each of the opening slots comprises an inner lateral surface and is corresponded to each of the first areas of the titanium-containing metal layer; forming a plurality of bottom coverage layers at the opening slots, each of the bottom coverage layers covers each of the first areas of the titanium-containing metal layer and comprises an outer lateral surface, wherein the outer lateral surface of each of the bottom coverage layers is in contact with the inner lateral surface of each of the opening slots; forming a plurality of copper bumps on the bottom coverage layers, each of the copper bumps comprises a first top surface, a ring surface, and a bottom surface located on the bottom coverage layer, wherein the ring surface of each of the copper bumps is in contact with the inner lateral surface of each of the opening slots; proceeding a heating procedure to ream the opening slots, mentioned heating procedure makes a first interval space located between the inner lateral surface of each of the opening slots and the outer lateral surface of each of the bottom coverage layers, and also makes a second interval space located between the inner lateral surface of each of the opening slots and the ring surface of each of the copper bumps; forming a plurality of external coverage layers at the first interval spaces, the second interval spaces, the first top surface of each of the copper bumps and the ring surface to make each of the external coverage layers connect with each of the bottom coverage layers therefore enabling the external coverage layer and the bottom coverage layer to form a wrap layer that surrounds the copper bump, wherein each of the copper bumps is completely surrounded by each of the wrap layers, and each of the external coverage layers comprises a second top surface; forming a plurality of connective layers on the second top surfaces of the external coverage layers; removing the photoresist layer; removing the second areas of the titanium-containing metal layer and enabling each of the first areas of the titanium-containing metal layer to form an under bump metallurgy layer located under each of the wrap layers. Owning to the reason that each of the wrap layers includes the external coverage layer and the bottom coverage layer, a short phenomenon occurred between two adjacent copper bumps via dissociation of copper ions can be prevented. Therefore, the space located between two adjacent copper bumps can be reduced. Besides, an indentation situation of the copper bumps may be occurred while removing the second areas of the titanium-containing layer. This invention may eliminate mentioned indentation situation due to protection from mentioned wrap layers.

DETAILED DESCRIPTION OF THE INVENTION

Figure 1:
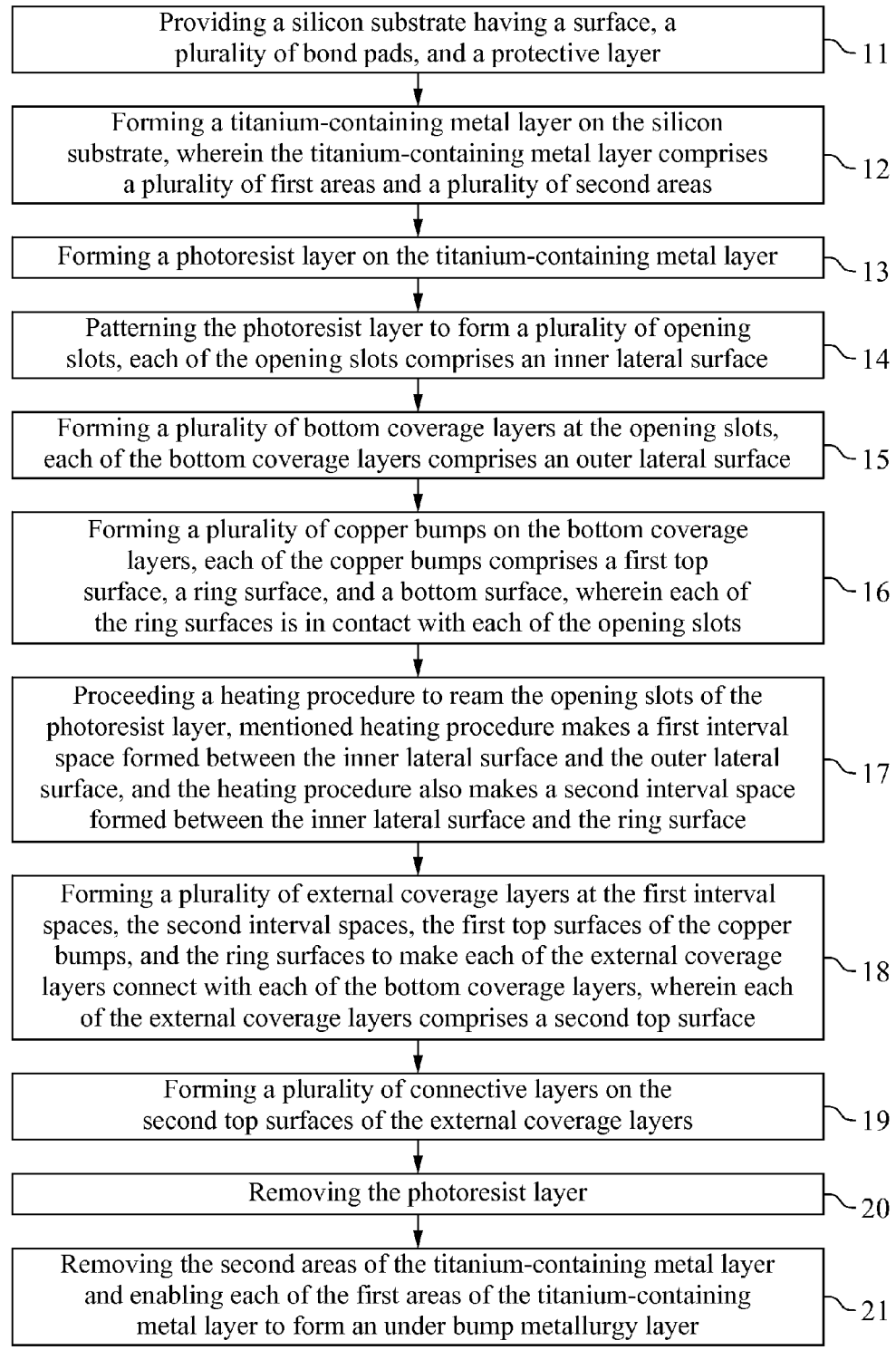
FIG. 1 is a manufacturing flow illustrating a bumping process in accordance with a preferred embodiment of the present invention.

With reference to FIGS. 1 and 2A-2K, a bumping process in accordance with a preferred embodiment of the present invention comprises the steps described as followed. First, referring to step 11 of FIG. 1 and FIG. 2A, providing a silicon substrate 110 having a surface 111, a plurality of bond pads 112 disposed on said surface 111, and a protective layer 113 disposed on said surface 111, wherein the protective layer 113 comprises a plurality of openings 113a, and the bond pads 112 are revealed by the openings 113a. Next, with reference to step 12 of FIG. 1 and FIG. 2B, forming a titanium-containing metal layer 200 on the silicon substrate 110, said titanium-containing metal layer 200 covers the bond pads 112 and comprises a plurality of first areas 210 and a plurality of second areas 220 located outside the first areas 210. Thereafter, referring to step 13 of FIG. 1 and FIG. 2C, forming a photoresist layer 300 on the titanium-containing metal layer 200. Then, referring to step 14 of FIG. 1 and FIG. 2D, patterning the photoresist layer 300 to form a plurality of opening slots 310, wherein each of the opening slots 310 comprises an inner lateral surface 311 and is corresponded to each of the first areas 210 of the titanium-containing metal layer 200. Afterwards, with reference to step 15 of FIG. 1 and FIG. 2E, forming a plurality of bottom coverage layers 131 at the opening slots 310, each of the bottom coverage layers 131 covers each of the first areas 210 of the titanium-containing metal layer 200 and comprises an outer lateral surface 131a, wherein the outer lateral surface 131a of each of the bottom coverage layers 131 is in contact with the inner lateral surface 311 of each of the opening slots 310. In this embodiment, the material of the bottom coverage layers 131 can be chosen from one of nickel, palladium or gold, and the thickness of the bottom coverage layer 131 is not bigger than 8 um.

Figure 2A:
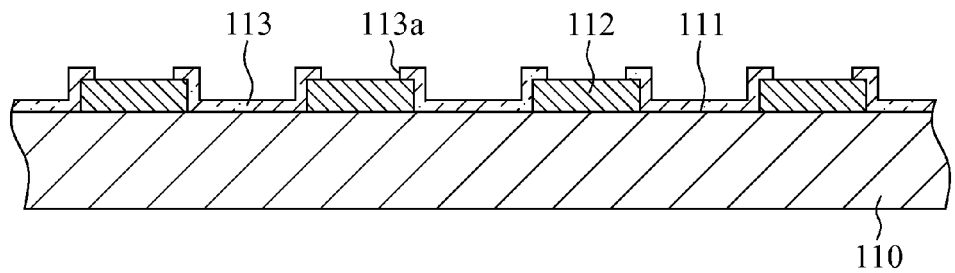
FIGS. 2A to 2K are section diagrams illustrating the bumping process in accordance with a preferred embodiment of the present invention.
Figure 2B:
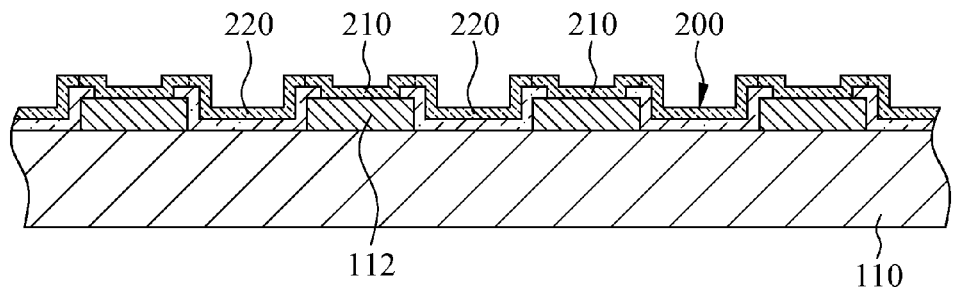
Figure 2C:
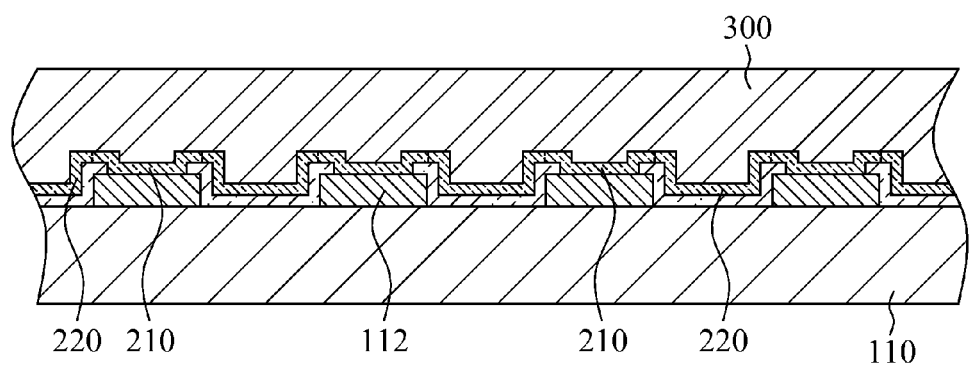
Figure 2D:
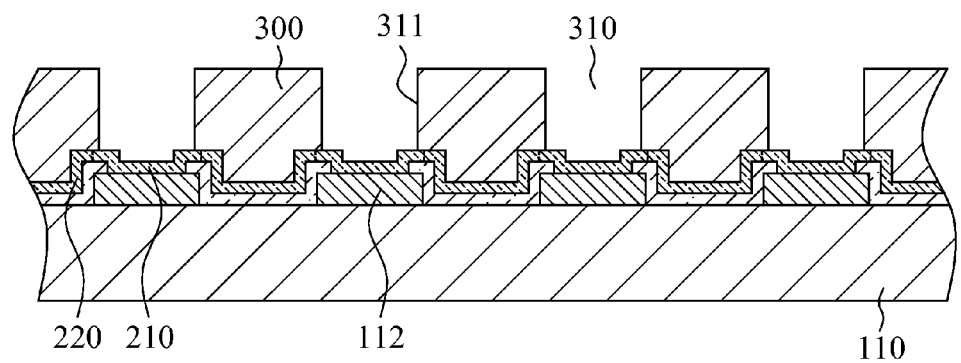
Figure 2E:
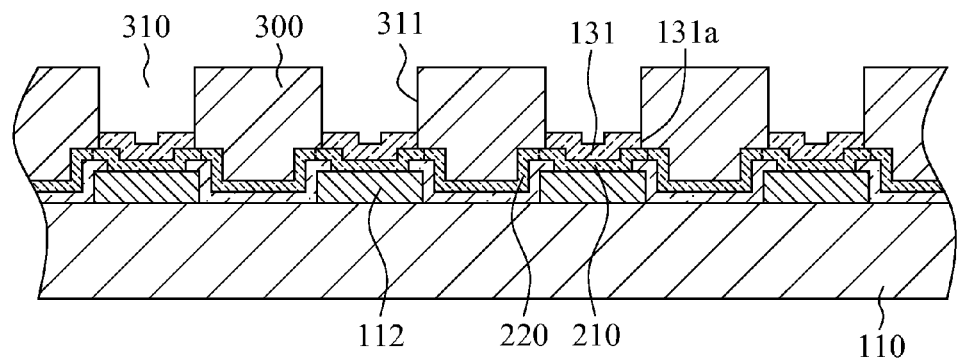
Figure 2F:
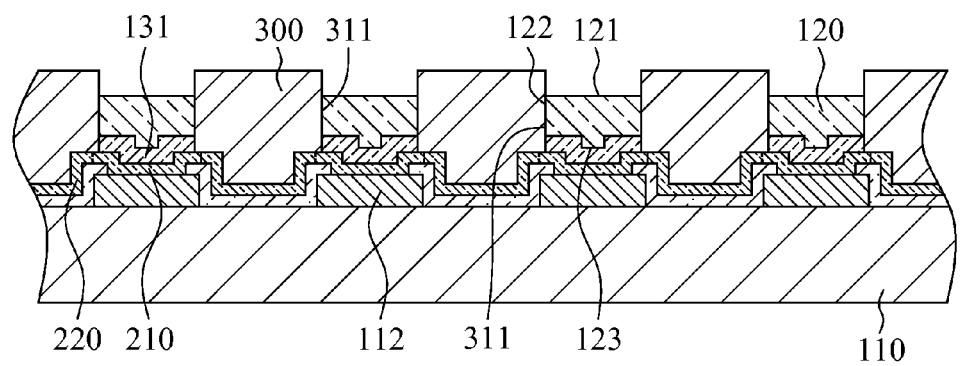
Figure 2G:
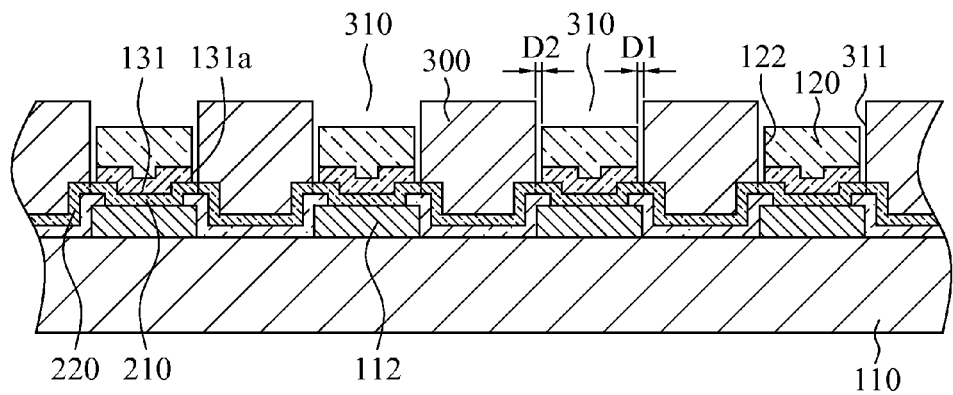
Figure 2H:
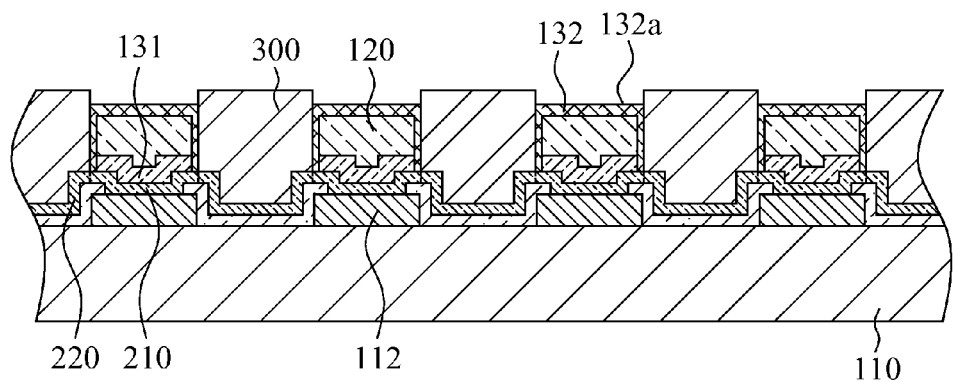
Figure 2I:
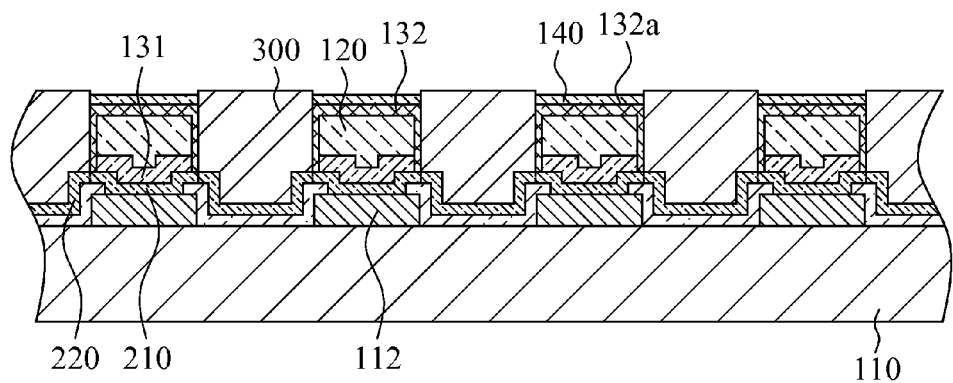
Figure 2J:
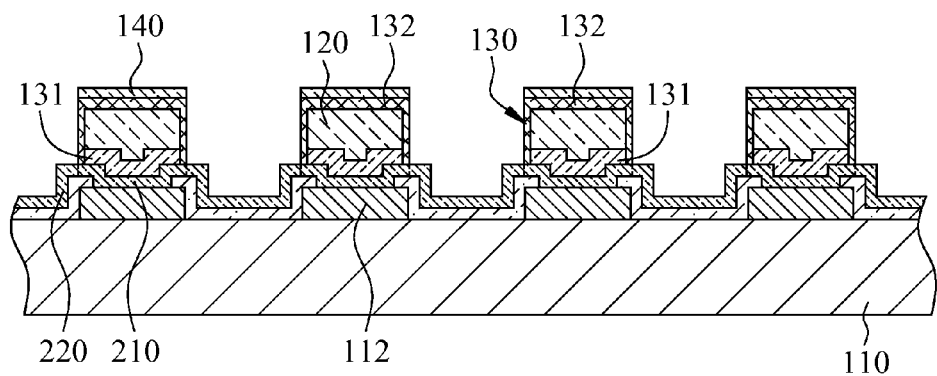

Next, with reference to step 16 of FIG. 1 and FIG. 2F, forming a plurality of copper bumps 120 on the bottom coverage layers 131, each of the copper bumps 120 comprises a top surface 121, a ring surface 122, and a bottom surface 123 located on the bottom coverage layer 131, wherein the ring surface 122 of each of the copper bumps 120 is in contact with the inner lateral surface 311 of each of the opening slots 310. Thereafter, with reference to step 17 of FIG. 1 and FIG. 2G, proceeding a heating procedure to ream the opening slots 310, mentioned heating procedure makes a first interval space D1 located between the inner lateral surface 311 of each of the opening slots 310 and the outer lateral surface 131a of each of the bottom coverage layers 131, and also makes a second interval space D2 located between the inner lateral surface 311 of each of the opening slots 310 and the ring surface 122 of each of the copper bumps 120. In this embodiment, the glass transition temperature in the heating procedure ranges from 70 to 140 degrees. Afterwards, referring to step 18 of FIG. 1 and the FIG. 2H, forming a plurality of external coverage layers 132 at the first interval spaces D1, the second interval spaces D2, the first top surface 121 of each of the copper bumps 120 and the ring surface 122 to make each of the external coverage layers 132 connect with each of the bottom coverage layers 131 therefore enabling the external coverage layer 132 and the bottom coverage layer 131 to form a wrap layer 130 that surrounds the copper bump 120, wherein each of the copper bumps 120 is completely surrounded by each of the wrap layers 130, and each of the external coverage layers 132 comprises a second top surface 132a. The external coverage layers 132 can be selected from one of nickel, palladium or gold, and the thickness of the external coverage layer 132 is not bigger than 2 um. Thereafter, referring to step 19 of FIG. 1 and FIG. 2I, forming a plurality of connective layers 140 on the second top surfaces 132a of the external coverage layers 132. In this embodiment, the material of the connective layers 140 can be gold. Then, referring to step 20 of FIG. 1 and FIG. 2J, removing the photoresist layer 300 to reveal the external coverage layers 132 and the connective layers 140. Eventually, with reference to step 21 of FIG. 1 and FIG. 2K, removing the second areas 220 of the titanium-containing metal layer 200 and enabling each of the first areas 210 of the titanium-containing metal layer 200 to form an under bump metallurgy layer 150 located under each of the wrap layers 130. The under bump metallurgy layer 150 can be selected from one of titanium/tungsten/gold, titanium/copper, titanium/tungsten/copper, or titanium/nickel (vanadium)/copper.

Figure 2K:
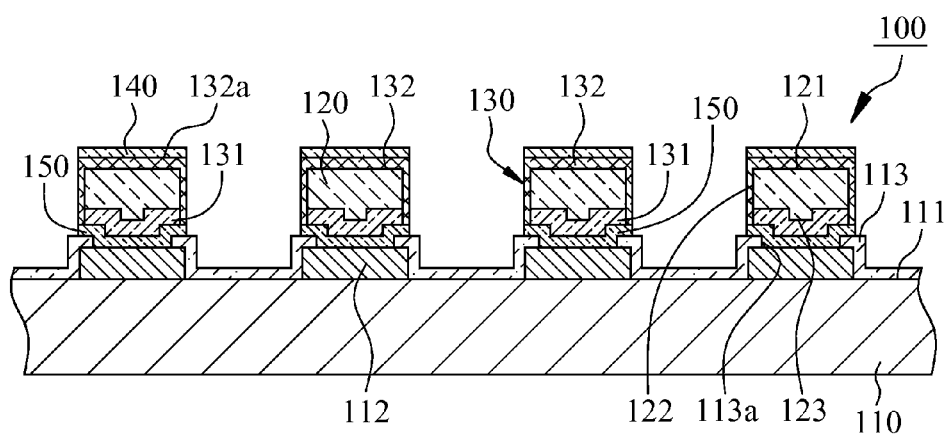

Referring to FIG. 2K, a bump structure 100 in accordance with a preferred embodiment at least includes a silicon substrate 110, a plurality of under bump metallurgy layers 150, a plurality of copper bumps 120, a plurality of wrap layers 130, and a plurality of connective layers 140. The silicon substrate 110 comprises a surface 111, a plurality of bond pads 112 disposed on the surface 111, and a protective layer 113 disposed on the surface 111, wherein the protective layer 113 comprises a plurality of openings 113a, and the bond pads 112 are revealed by the openings 113a. The under bump metallurgy layers 150 are formed on the bond pads 112, and the material of the under bump metallurgy layers can be chosen from titanium/tungsten/gold, titanium/copper, titanium/tungsten/copper, or titanium/nickel/copper. Each of the copper bumps 120 is formed on the under bump metallurgy layers 150 and comprises a first top surface 121, a ring surface 122, and a bottom surface 123. Each of the copper bumps 120 is completely surrounded by each of the wrap layers 130. Each of the wrap layers 130 includes a bottom coverage layer 131 and an external coverage layer 132 in connection with the bottom coverage 131. Each of the external coverage layers 132 is formed on the first top surface 121 of each of the copper bumps 120 and the ring surface 122, and mentioned external coverage layer 132 comprises a second top surface 132a. Each of the bottom coverage layers 131 is formed on each of the bump metallurgy layers 150, and the bottom surface 123 of each of the copper bumps 120 is located on each of the bottom coverage layers 131. In this embodiment, the material of the bottom coverage layers 131 and the external coverage layers 132 can be chosen from one of nickel, palladium or gold, the thickness of the bottom coverage layer 131 is not bigger than 8 um, and the thickness of the external coverage layer 132 is not bigger than 2 um. The connective layers 140 are formed on the second top surfaces 132a of the external coverage layers 132. In this embodiment, the material of the connective layers can be gold. Owning to the reason that each of the wrap layers 130 includes the external coverage layer 132 and the bottom coverage layer 131, a short phenomenon occurred between two adjacent copper bumps 120 via dissociation of copper ions can be prevented. Therefore, the space located between two adjacent copper bumps 120 can be effectively reduced. Besides, an indentation situation of the copper bumps 120 might be occurred while removing the second areas 220 of the titanium-containing layer 200. This invention may eliminate mentioned indentation situation due to protection from mentioned wrap layers 130.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A bumping process at least comprising:

providing a silicon substrate having a surface, a plurality of bond pads disposed on said surface, and a protective layer disposed on said surface, wherein the protective layer comprises a plurality of openings, and the bond pads are revealed by the openings;

forming a titanium-containing metal layer on the silicon substrate, said titanium-containing metal layer covers the bond pads and comprises a plurality of first areas and a plurality of second areas located outside the first areas;

forming a photoresist layer on the titanium-containing metal layer;

patterning the photoresist layer to form a plurality of opening slots, wherein each of the opening slots comprises an inner lateral surface and is corresponded to each of the first areas of the titanium-containing metal layer;

forming a plurality of bottom coverage layers at the opening slots, each of the bottom coverage layers covers each of the first areas of the titanium-containing metal layer and comprises an outer lateral surface;

forming a plurality of copper bumps on the bottom coverage layers, each of the copper bumps comprises a first top surface, a ring surface, and a bottom surface located on the bottom coverage layer;

proceeding a heating procedure to ream the opening slots, mentioned heating procedure makes a first interval space located between the inner lateral surface of each of the opening slots and the outer lateral surface of each of the bottom coverage layers, and the heating procedure also makes a second interval space located between the inner lateral surface of each of the opening slots and the ring surface of each of the copper bumps;

forming a plurality of external coverage layers at the first interval spaces, the second interval spaces, the first top surfaces of the copper bumps and the ring surfaces to make each of the external coverage layers connect with each of the bottom coverage layers therefore enabling the external coverage layer and the bottom coverage layer to form a wrap layer that surrounds the copper bump, wherein each of the copper bumps is completely surrounded by each of the wrap layers, and each of the external coverage layers comprises a second top surface;

forming a plurality of connective layers on the second top surfaces of the external coverage layers;

removing the photoresist layer; and removing the second areas of the titanium-containing metal layer and enabling each of the first areas of the titanium-containing metal layer to form an under bump metallurgy layer located under each of the wrap layers.

2. The bumping process in accordance with claim 1, wherein the glass transition temperature in the heating procedure ranges from 70 to 140 degrees.

3. The bumping process in accordance with claim 1, wherein the material of the connective layers can be gold.

4. The bumping process in accordance with claim 1, wherein the material of the under bump metallurgy layer can be selected from one of titanium/tungsten/gold, titanium/copper, titanium/tungsten/copper, or titanium/nickel (vanadium)/copper.

5. The bumping process in accordance with claim 1, wherein the material of the bottom coverage layers and the external coverage layers can be chosen from one of nickel, palladium or gold.

6. The bumping process in accordance with claim 1, wherein in the step of forming the bottom coverage layers at the opening slots, the outer lateral surface of each of the bottom coverage layers is in contact with the inner lateral surface of each of the opening slots.

7. The bumping process in accordance with claim 1, wherein in the step of forming the copper bumps on the bottom coverage layers, the ring surface of each of the copper bumps is in contact with the inner lateral surface of each of the opening slots.

* * * * *